(12) United States Patent
Strohmann et al.

(10) Patent No.: US 11,392,249 B2
(45) Date of Patent: Jul. 19, 2022

(54) BROADBAND ULTRASONIC SENSOR

(71) Applicant: Qualcomm Incorporated, San Diego, CA (US)

(72) Inventors: Jessica Liu Strohmann, Cupertino, CA (US); Yipeng Lu, Davis, CA (US); Hrishikesh Vijaykumar Panchawagh, Cupertino, CA (US)

(73) Assignee: QUALCOMM Incorporated, San Diego, CA (US)

( * ) Notice: Subject to any disclaimer, the term of this patent is extended or adjusted under 35 U.S.C. 154(b) by 105 days.

(21) Appl. No.: 16/407,070

(22) Filed: May 8, 2019

(65) Prior Publication Data

US 2020/0356196 A1 Nov. 12, 2020

(51) Int. Cl.
*G06F 3/043* (2006.01)
*B06B 1/06* (2006.01)
*H01L 27/32* (2006.01)
*G06V 40/13* (2022.01)
*H01L 41/187* (2006.01)
*H01L 41/193* (2006.01)

(52) U.S. Cl.
CPC ............ *G06F 3/043* (2013.01); *B06B 1/0611* (2013.01); *G06V 40/1306* (2022.01); *H01L 27/323* (2013.01); *H01L 41/1875* (2013.01); *H01L 41/1876* (2013.01); *H01L 41/193* (2013.01)

(58) Field of Classification Search
None
See application file for complete search history.

(56) References Cited

U.S. PATENT DOCUMENTS

| | | | |
|---|---|---|---|
| 2014/0354596 A1 | 12/2014 | Djordjev et al. | |
| 2015/0015515 A1* | 1/2015 | Dickinson | G01H 1/04 345/173 |
| 2015/0261261 A1* | 9/2015 | Bhagavatula | G06K 9/00053 361/679.56 |
| 2016/0363562 A1* | 12/2016 | Takahashi | G01N 29/043 |
| 2017/0326593 A1* | 11/2017 | Garlepp | G10K 11/346 |
| 2017/0330553 A1 | 11/2017 | Garlepp et al. | |
| 2018/0046836 A1* | 2/2018 | Hinger | G01S 7/52079 |
| 2018/0307885 A1* | 10/2018 | Zheng | G06K 9/00053 |
| 2019/0101437 A1 | 4/2019 | Miranto et al. | |
| 2019/0354738 A1* | 11/2019 | Baek | G06K 9/0002 |

FOREIGN PATENT DOCUMENTS

KR 20180061826 A 6/2018

OTHER PUBLICATIONS

International Search Report and Written Opinion—PCT/US2020/031375—ISA/EPO—dated Oct. 26, 2020.

* cited by examiner

*Primary Examiner* — Amare Mengistu
*Assistant Examiner* — Sarvesh J Nadkarni
(74) *Attorney, Agent, or Firm* — Qualcomm Incorporated

(57) ABSTRACT

An ultrasonic sensor includes a substrate, a platen and an acoustic stack disposed between the substrate and the platen, including at least one piezoelectric layer. The ultrasonic transducer exhibits a signal-to-noise ratio of at least 4 over a frequency range of at least 9 to 16 MHz.

19 Claims, 10 Drawing Sheets

Detail A

Detail B

BROADBAND ULTRASONIC SENSOR

TECHNICAL FIELD

This disclosure relates to ultrasonic transducer imaging array and, more particularly to techniques for providing a broadband ultrasonic imaging array.

DESCRIPTION OF THE RELATED TECHNOLOGY

Ultrasonic sensor systems may use a transmitter to generate and send an ultrasonic wave through a transmissive medium and towards an object to be detected and/or imaged. The ultrasonic transmitter may be operatively coupled with an ultrasonic sensor array configured to detect portions of the ultrasonic wave that are reflected from the object. At each material interface encountered buy the ultrasonic pulse, a portion of the ultrasonic pulse may be reflected. In some implementations, an ultrasonic pulse may be produced by starting and stopping the transmitter during a short interval of time (e.g. less than 1 microsecond). An ultrasonic sensor system may include biometric sensors, such as fingerprint or handprint sensors, and/or other ultrasonic imaging applications.

Piezoelectric ultrasonic transducers are attractive candidates for such applications and may be configured as a multilayer stack that includes a piezoelectric layer. The piezoelectric layer may convert vibrations caused by ultrasonic reflections into electrical output signals. In some implementations, the ultrasonic sensor system further includes a thin-film transistor (TFT) layer that may include an array of sensor pixel circuits that may, for example, amplify electrical output signals generated by the piezoelectric layer. The piezeoelectric layer may include one or more of lead zirconate titanate (PZT), single crystal lead magnesium niobate-lead titanate (PMN-PT), a PZT ceramic, polyvinylidene fluoride (PVDF), poly(vinylidenefluoride-co-trifluoroethylene) (PVDF-TrFE) and/or another PVDF copolymer.

In some applications, a two-dimensional array of a large number of transducer elements may be integrated with and disposed behind or "under" a platen (a "cover plate" or "cover glass") configured as a display screen with which the user interacts. The display screen, for example, may provide a user touch interface and/or be incorporated in a personal electronic device such as a mobile phone or tablet and may include multi-layer stacks of glass, plastic and/or adhesive layers.

The piezoelectric ultrasonic transducer may be required to accommodate a variety of multi-layer stack configurations thickness and material properties, some of which may change during the life of the personal electronic device as a result, for example, of installation, removal or replacement of a screen protector. As a result, a piezoelectric ultrasonic transducer configuration exhibiting good performance over a broader range of frequencies is desirable.

SUMMARY

The systems, methods and devices of this disclosure each have several innovative aspects, no single one of which is solely responsible for the desirable attributes disclosed herein.

One innovative aspect of the subject matter described in this disclosure relates to an ultrasonic sensor including a substrate, a platen, and an acoustic stack disposed between the substrate and the platen, including at least one piezoelectric layer. The ultrasonic sensor is configured to exhibit a signal-to-noise ratio (SNR) of at least 4 over a frequency range of at least 9 to 16 MHz.

In some examples, the ultrasonic sensor may further include an OLED stack, the OLED stack and the platen each exhibiting an approximately similar acoustic impedance. In some examples, the OLED stack may include a multilayer structure including at least two of a polarizer, an OLED layer, and a touchscreen layer.

In some examples, the platen may include a polycarbonate (PC) layer. In some examples, the platen may include a multilayer structure including the PC layer and a poly methacrylate layer.

In some examples, the sensor may be configured to operate with ultrasonic waves having a characteristic wavelength and the platen may have a thickness less than ¼ of the characteristic wavelength. In some examples, the thickness may be less than ¹⁄₁₀ of the characteristic wavelength.

In some examples, the piezoelectric layer may include one or more of lead zirconate titanate (PZT), single crystal lead magnesium niobate-lead titanate (PMN-PT), a PZT ceramic, polyvinylidene fluoride (PVDF), poly(vinylidenefluoride-co-trifluoroethylene) (PVDF-TrFE) and/or another PVDF copolymer.

In some examples, the piezoelectric layer may include a thin-film transistor (TFT) layer. In some examples, the TFT layer may have a thickness less than 300 In some examples, the TFT layer may be configured to resonate at one or more frequencies in the range of 5-20 MHz. In some examples, the sensor may be configured to operate with ultrasonic waves having a characteristic wavelength and the acoustic stack may have a total thickness less than ½ the characteristic wavelength. In some examples, the acoustic stack may have a total thickness in a range of 90-200 In some examples, the ultrasonic sensor may further include a spacer disposed between the acoustic stack and the platen. In some examples, the sensor may be configured to operate with ultrasonic waves having a characteristic wavelength and a combined thickness of the acoustic stack and the spacer may be less than ½ the characteristic wavelength. In some examples, the combined thickness is in a range of 90-200 µm.

In some examples, the platen includes a cover glass layer and the acoustic stack comprises a TFT layer. In some examples, the ultrasonic sensor further includes a spacer and an adhesive layer disposed between the cover glass layer and the TFT layer, or behind the TFT layer. In some examples, the adhesive layer may be a pressure sensitive adhesive (PSA) or optical clear adhesive (OCA).

In some examples, the sensor may be configured to exhibit SNR of at least 4 over a frequency range of at least 5-20 MHz.

According to some implementations, an ultrasonic sensor includes a substrate, a platen, and an acoustic stack disposed between the substrate and the platen, including at least one piezoelectric layer. The piezoelectric layer includes a thin-film transistor (TFT) layer, the sensor is configured to operate with ultrasonic waves having a characteristic wavelength, and the acoustic stack has a total thickness less than ½ the characteristic wavelength.

In some examples, the ultrasonic sensor may be configured to exhibit a signal-to-noise ratio (SNR) of at least 4 over a frequency range of at least 9 to 16 MHz. In some examples, the ultrasonic sensor may further include an OLED stack, the OLED stack and the platen each exhibiting an approximately similar acoustic impedance. In some examples, the OLED stack may be a multilayer structure including at least two of a polarizer, an OLED layer, a touchscreen layer. In some examples, the platen may have a thickness less than ¼ of the characteristic wavelength. In some examples, the piezoelectric layer may include lead zirconate titanate (PZT), single crystal lead magnesium niobate-lead titanate (PMN-PT), a PZT ceramic, polyvinylidene fluoride (PVDF), poly(vinylidenefluoride-co-trifluoroethylene) (PVDF-TrFE) and/or another PVDF copolymer. In some examples, the TFT layer may have a thickness less than 300 μm. In some examples, the TFT layer may be configured to resonate at one or more frequencies in the range of 5-20 MHz. In some examples, the ultrasonic sensor may further include a spacer disposed between the acoustic stack and the platen. In some examples, a combined thickness of the acoustic stack and the spacer may be less than ½ the characteristic wavelength. In some examples, the combined thickness may be in a range of 90-200 In some examples, the platen may include a cover glass layer. In some examples, the ultrasonic sensor may further include a spacer and an adhesive layer disposed between the cover glass layer and the TFT layer. In some examples, the adhesive layer may be a pressure sensitive adhesive (PSA) or optical clear adhesive (OCA).

BRIEF DESCRIPTION OF THE DRAWINGS

Details of one or more implementations of the subject matter described in this specification are set forth in this disclosure and the accompanying drawings. Other features, aspects, and advantages will become apparent from a review of the disclosure. Note that the relative dimensions of the drawings and other diagrams of this disclosure may not be drawn to scale. The sizes, thicknesses, arrangements, materials, etc., shown and described in this disclosure are made only by way of example and should not be construed as limiting. Like reference numbers and designations in the various drawings indicate like elements.

DETAILED DESCRIPTION

Figure 1:
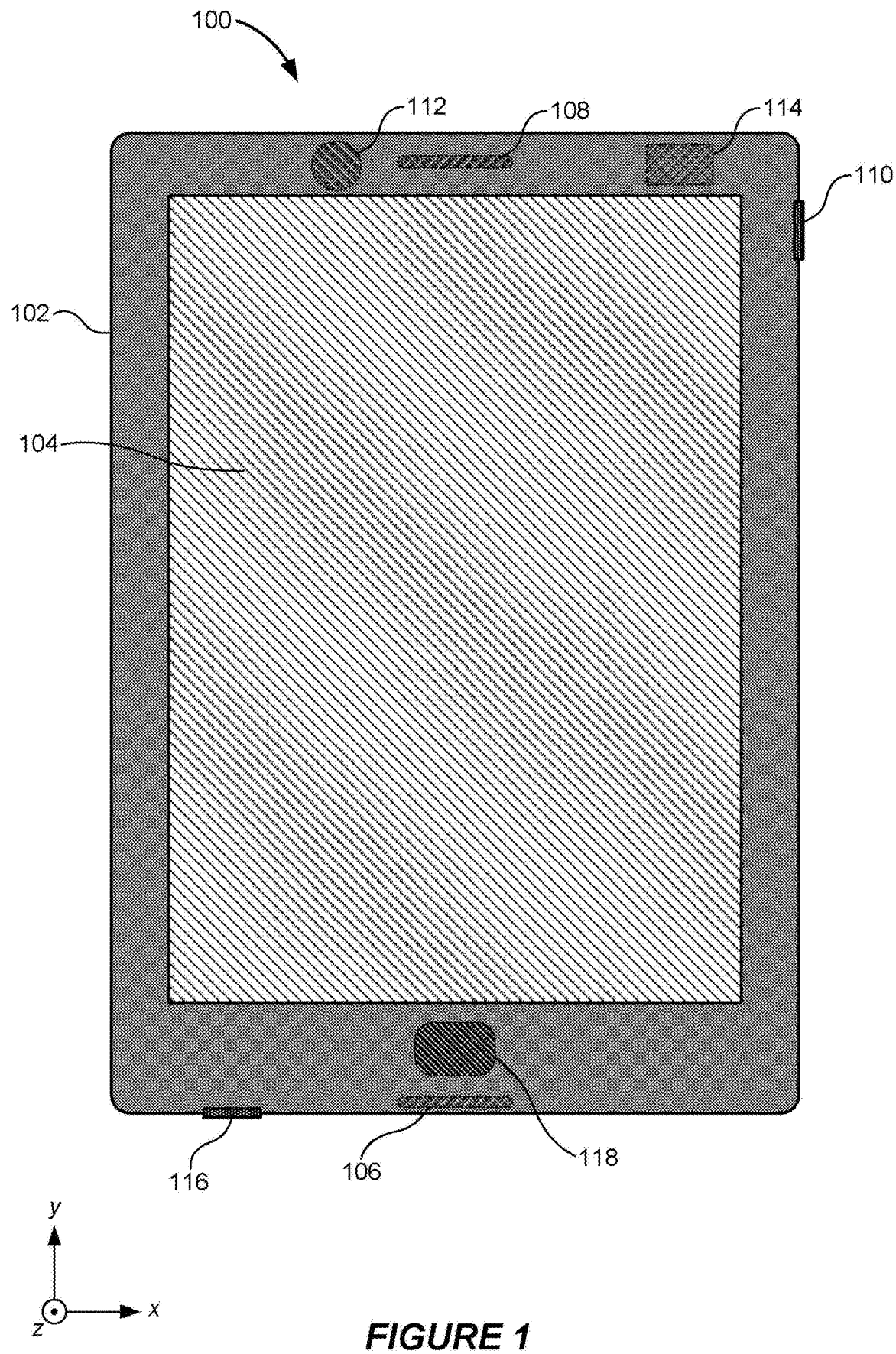
FIG. 1 shows a front view of a diagrammatic representation of an example of an electronic device that includes an ultrasonic sensing system according to some implementations.

The following description is directed to certain implementations for the purposes of describing the innovative aspects of this disclosure. However, a person having ordinary skill in the art will readily recognize that the teachings herein may be applied in a multitude of different ways. The described implementations may be implemented in any device, apparatus, or system that includes a sensor system. In addition, it is contemplated that the described implementations may be included in or associated with a variety of electronic devices such as, but not limited to: mobile telephones, multimedia Internet enabled cellular telephones, mobile television receivers, wireless devices, smartphones, smart cards, wearable devices such as bracelets, armbands, wristbands, rings, headbands and patches, etc., Bluetooth® devices, personal data assistants (PDAs), wireless electronic mail receivers, hand-held or portable computers, netbooks, notebooks, smartbooks, tablets, printers, copiers, scanners, facsimile devices, global positioning system (GPS) receivers/navigators, cameras, digital media players (such as MP3 players), camcorders, game consoles, wrist watches, clocks, calculators, television monitors, flat panel displays, electronic reading devices (e.g., e-readers), mobile health devices, computer monitors, auto displays (including odometer and speedometer displays, etc.), cockpit controls and/or displays, steering wheels, camera view displays (such as the display of a rear view camera in a vehicle), electronic photographs, electronic billboards or signs, projectors, architectural structures, microwaves, refrigerators, stereo systems, cassette recorders or players, DVD players, CD players, VCRs, radios, portable memory chips, washers, dryers, washer/dryers, automated teller machines (ATMs), parking meters, packaging (such as in electromechanical systems (EMS) applications including microelectromechanical systems (MEMS) applications, as well as non-EMS applications), aesthetic structures (such as display of images on a piece of jewelry or clothing) and a variety of EMS devices. The teachings herein also may be used in applications such as, but not limited to, electronic switching devices, radio frequency filters, sensors, accelerometers, gyroscopes, motion-sensing devices, magnetometers, inertial components for consumer electronics, parts of consumer electronics products, varactors, liquid crystal devices, electrophoretic devices, drive schemes, manufacturing processes and electronic test equipment. Thus, the teachings are not intended to be limited to the implementations depicted solely in the Figures, but instead have wide applicability as will be readily apparent to one having ordinary skill in the art.

In some implementations, ultrasonic sensor systems include piezoelectric material for the transmission and receiving of ultrasonic waves.

For example, a voltage applied across piezoelectric material corresponding to a transmitter may result in the piezoelectric material stretching or contracting, e.g., being deformed such that the material is strained in response to the applied voltage, resulting in the generation of the ultrasonic wave, as previously discussed. The reflected signals (e.g., the reflected portions of the ultrasonic wave, as previously discussed) may result in the stretching or contracting of piezoelectric material corresponding to a receiver. This results in the generation of a surface charge, and therefore, a voltage across the piezoelectric material that may be used as an electrical output signal representing a portion of raw image data that represents fingerprint image data.

Some implementations of the subject matter described in this disclosure may be practiced to realize a broadband ultrasonic sensor offering one or more of the following potential advantages: a high signal-to-noise ratio over an expanded frequency range obviates or reduces the need for sensor tuning and accommodates a variety of user installed screen protectors and may be configured to obtain subdermis imaging as well as fingerprint imaging.

FIG. 1 shows a front view of a diagrammatic representation of an example of an electronic device 100 that includes an ultrasonic sensing system according to some implementations. The electronic device 100 may be representative of, for example, various portable computing devices such as cellular phones, smartphones, multimedia devices, personal gaming devices, tablet computers and laptop computers, among other types of portable computing devices. However, various implementations described herein are not limited in application to portable computing devices. Indeed, various techniques and principles disclosed herein may be applied in traditionally non-portable devices and systems, such as in computer monitors, television displays, kiosks, vehicle navigation devices and audio systems, among other applications.

In the illustrated implementation, the electronic device 100 includes a housing (or "case") 102 within which various circuits, sensors and other electrical components may be disposed. In the illustrated implementation, the electronic device 100 also includes a display (that may be referred to herein as a "touchscreen display" or a "touch-sensitive display") 104. The display 104 may generally be representative of any of a variety of suitable display types that employ any of a variety of suitable display technologies. For example, the display 104 may be a digital micro-shutter (DMS)-based display, a light-emitting diode (LED) display, an organic LED (OLED) display, a liquid crystal display (LCD), an LCD display that uses LEDs as backlights, a plasma display, an interferometric modulator (IMOD)-based display, or another type of display suitable for use in conjunction with touch-sensitive user interface (UI) systems.

The electronic device 100 may include various other devices or components for interacting with, or otherwise communicating information to or receiving information from, a user. For example, the electronic device 100 may include one or more microphones 106, one or more speakers 108, and in some cases one or more at least partially mechanical buttons 110. The electronic device 100 may include various other components enabling additional features such as, for example, one or more video or still-image cameras 112, one or more wireless network interfaces 114 (for example, Bluetooth, WiFi or cellular) and one or more non-wireless interfaces 116 (for example, a universal serial bus (USB) interface or an HDMI interface).

The electronic device 100 may include an ultrasonic sensing system 118 capable of imaging an object signature, such as a fingerprint, palm print or handprint. In some implementations, the ultrasonic sensing system 118 may function as a touch-sensitive control button. In some implementations, a touch-sensitive control button may be implemented with a mechanical or electrical pressure-sensitive system that is positioned under or otherwise integrated with the ultrasonic sensing system 118. In other words, in some implementations, a region occupied by the ultrasonic sensing system 118 may function both as a user input button to control the electronic device 100 as well as a sensor to enable security features such as user authentication based on, for example, a fingerprint, palm print or handprint.

Figure 2A:
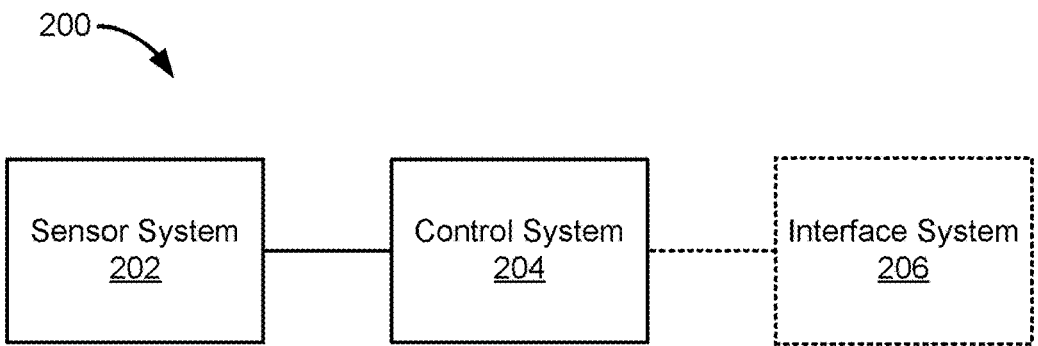
FIG. 2A shows a block diagram representation of components of an example of an ultrasonic sensing system, according to some implementations.

FIG. 2A shows a block diagram representation of components of an example of an ultrasonic sensing system, according to some implementations. In the illustrated implementation, an ultrasonic sensing system 200 includes a sensor system 202 and a control system 204 electrically coupled with the sensor system 202. The sensor system 202 may be capable of scanning a target object and providing raw measured image data usable to obtain an object signature of, for example, a human appendage, such as one or more fingers or toes, a palm, hand or foot. The control system 204 may be capable of controlling the sensor system 202 and processing the raw measured image data received from the sensor system 202. In some implementations, the ultrasonic sensing system 200 may include an interface system 206 capable of transmitting or receiving data, such as raw or processed measured image data, to or from various components within or integrated with the ultrasonic sensing system 200 or, in some implementations, to or from various components, devices or other systems external to the ultrasonic sensing system 200.

Figure 2B:
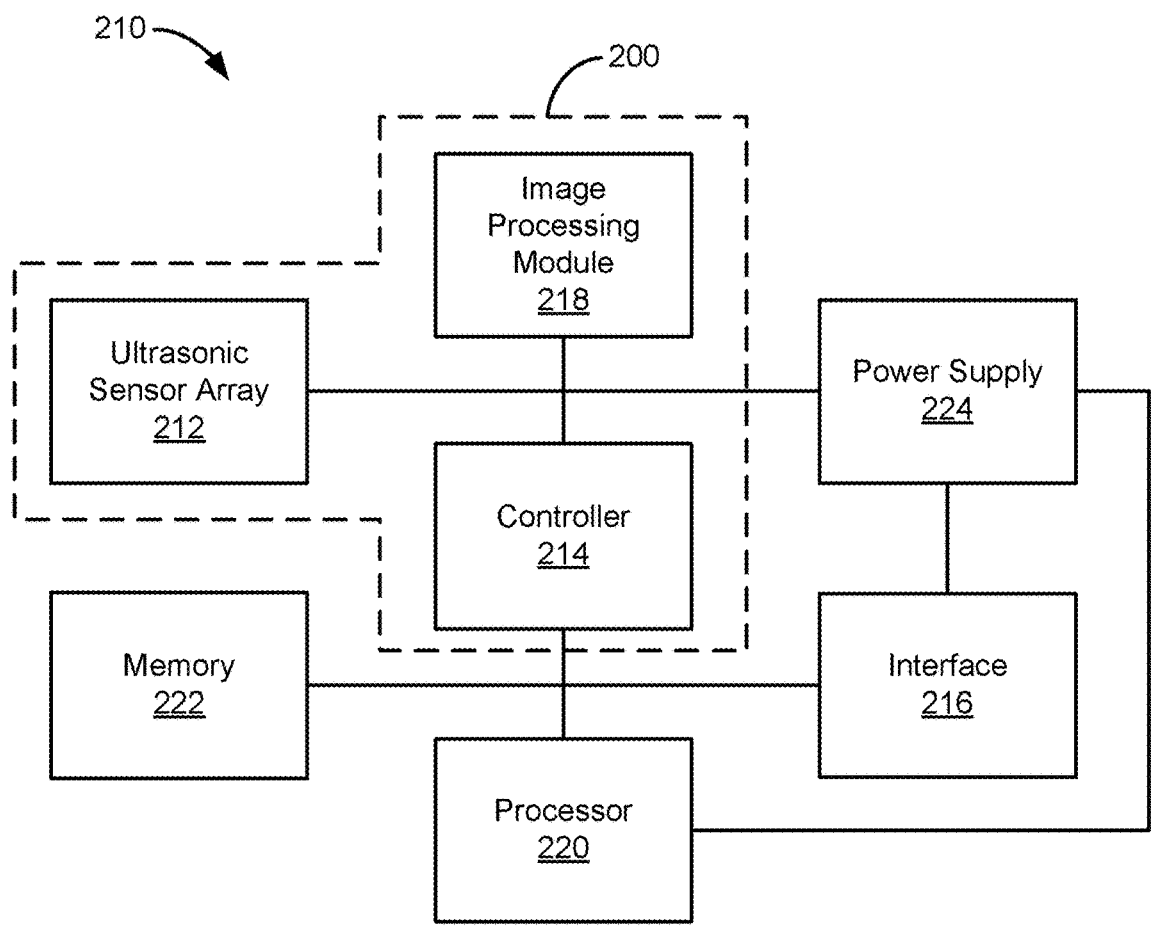
FIG. 2B shows a block diagram representation of components of an example of an electronic device, according to some implementations.

FIG. 2B shows a block diagram representation of components of an example of an electronic device, according to some implementations. In the illustrated example, an electronic device 210 includes the ultrasonic sensing system 200 of FIG. 2A. For example, the electronic device 210 may be a block diagram representation of the electronic device 100 shown in and described with reference to FIG. 1 above. The sensor system 202 of the ultrasonic sensing system 200 of the electronic device 210 may be implemented with an ultrasonic sensor array 212. The control system 204 of the ultrasonic sensing system 200 may be implemented with a controller 214 that is electrically coupled with the ultrasonic sensor array 212. While the controller 214 is shown and described as a single component, in some implementations, the controller 214 may collectively refer to two or more distinct control units or processing units in electrical communication with one another. In some implementations, the controller 214 may include one or more of a general purpose single- or multi-chip processor, a central processing unit (CPU), a digital signal processor (DSP), an applications processor, an application specific integrated circuit (ASIC), a field programmable gate array (FPGA) or other programmable logic device (PLD), discrete gate or transistor logic, discrete hardware components, or any combination thereof designed to perform the functions and operations described herein.

The ultrasonic sensing system 200 of FIG. 2B may include an image processing module 218. In some implementations, raw measured image data provided by the ultrasonic sensor array 212 may be sent, transmitted, communicated or otherwise provided to the image processing module 218. The image processing module 218 may include any suitable combination of hardware, firmware and software configured, adapted or otherwise operable to process the image data provided by the ultrasonic sensor array 212. In some implementations, the image processing module 218 may include signal or image processing circuits or circuit components including, for example, amplifiers (such as instrumentation amplifiers or buffer amplifiers), analog or digital mixers or multipliers, switches, analog-to-digital converters (ADCs), passive or active analog filters, among others. In some implementations, one or more of such circuits or circuit components may be integrated within the controller 214, for example, where the controller 214 is implemented as a system-on-chip (SoC) or system-in-package (SIP). In some implementations, one or more of such circuits or circuit components may be integrated within a DSP included within or coupled with the controller 214. In some implementations, the image processing module 218 may be implemented at least partially via software. For example, one or more functions of, or operations performed by, one or more of the circuits or circuit components just described may instead be performed by one or more software modules executing, for example, in a processing unit of the controller 214 (such as in a general purpose processor or a DSP).

In some implementations, in addition to the ultrasonic sensing system 200, the electronic device 210 may include a separate processor 220, a memory 222, an interface 216 and a power supply 224. In some implementations, the controller 214 of the ultrasonic sensing system 200 may control the ultrasonic sensor array 212 and the image processing module 218, and the processor 220 of the electronic device 210 may control other components of the electronic device 210. In some implementations, the processor 220 communicates data to the controller 214 including, for example, instructions or commands. In some such implementations, the controller 214 may communicate data to the processor 220 including, for example, raw or processed image data. It should also be understood that, in some other implementations, the functionality of the controller 214 may be implemented entirely, or at least partially, by the processor 220. In some such implementations, a separate controller 214 for the ultrasonic sensing system 200 may not be required because the functions of the controller 214 may be performed by the processor 220 of the electronic device 210.

Depending on the implementation, one or both of the controller 214 and processor 220 may store data in the memory 222. For example, the data stored in the memory 222 may include raw measured image data, filtered or otherwise processed image data, estimated PSF or estimated image data, and final refined PSF or final refined image data. The memory 222 may store processor-executable code or other executable computer-readable instructions capable of execution by one or both of the controller 214 and the processor 220 to perform various operations (or to cause other components such as the ultrasonic sensor array 212, the image processing module 218, or other modules to perform operations), including any of the calculations, computations, estimations or other determinations described herein (including those presented in any of the equations below). It should also be understood that the memory 222 may collectively refer to one or more memory devices (or "components"). For example, depending on the implementation, the controller 214 may have access to and store data in a different memory device than the processor 220. In some implementations, one or more of the memory components may be implemented as a NOR- or NAND-based Flash memory array. In some other implementations, one or more of the memory components may be implemented as a different type of non-volatile memory. Additionally, in some implementations, one or more of the memory components may include a volatile memory array such as, for example, a type of RAM.

In some implementations, the controller 214 or the processor 220 may communicate data stored in the memory 222 or data received directly from the image processing module 218 through an interface 216. For example, such communicated data can include image data or data derived or otherwise determined from image data. The interface 216 may collectively refer to one or more interfaces of one or more various types. In some implementations, the interface 216 may include a memory interface for receiving data from or storing data to an external memory such as a removable memory device. Additionally or alternatively, the interface 216 may include one or more wireless network interfaces or one or more wired network interfaces enabling the transfer of raw or processed data to, as well as the reception of data from, an external computing device, system or server.

A power supply 224 may provide power to some or all of the components in the electronic device 210. The power supply 224 may include one or more of a variety of energy storage devices. For example, the power supply 224 may include a rechargeable battery, such as a nickel-cadmium battery or a lithium-ion battery. Additionally or alternatively, the power supply 224 may include one or more supercapacitors. In some implementations, the power supply 224 may be chargeable (or "rechargeable") using power accessed from, for example, a wall socket (or "outlet") or a photovoltaic device (or "solar cell" or "solar cell array") integrated with the electronic device 210. Additionally or alternatively, the power supply 224 may be wirelessly chargeable.

As used hereinafter, the term "processing unit" refers to any combination of one or more of a controller of an ultrasonic system (for example, the controller 214), an image processing module (for example, the image processing module 218), or a separate processor of a device that includes the ultrasonic system (for example, the processor 220). In other words, operations that are described below as being performed by or using a processing unit may be performed by one or more of a controller of the ultrasonic system, an image processing module, or a separate processor of a device that includes the ultrasonic sensing system.

Figure 3A:
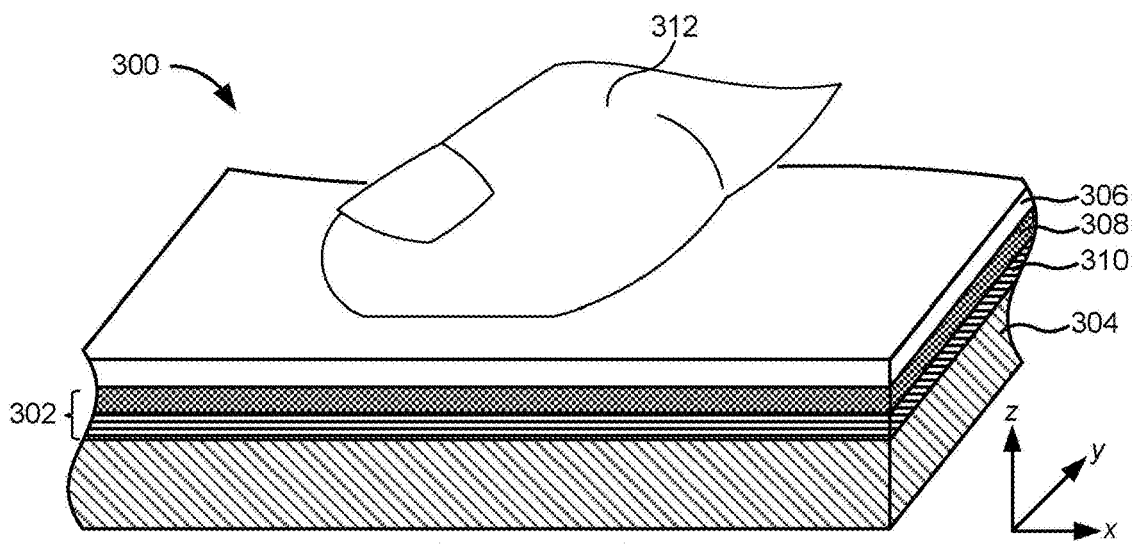
FIGS. 3A-3C show cross-sectional views of examples of an ultrasonic sensing system, according to some implementations.
Figure 3B:
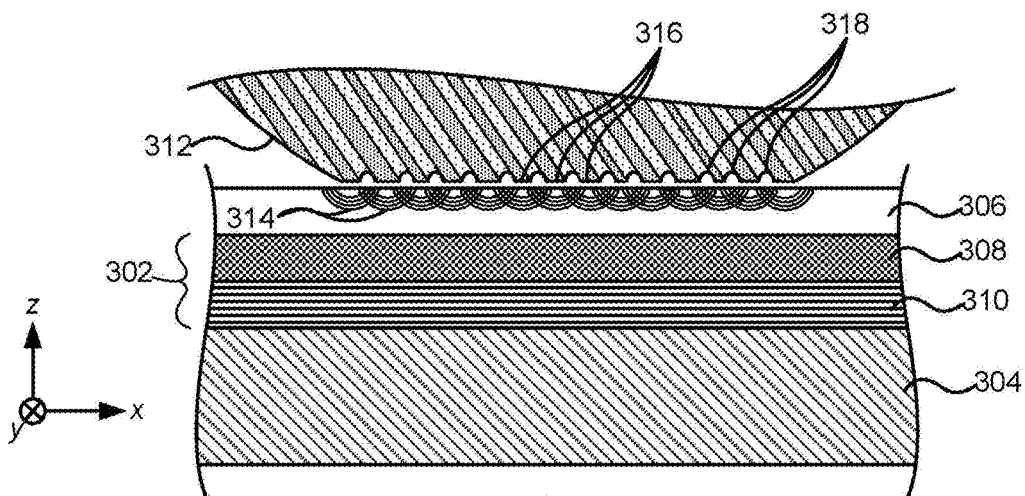

FIG. 3A shows a cross-sectional of an example of an ultrasonic sensing system according to some implementations. FIG. 3B shows an enlarged cross-sectional side view of the ultrasonic sensing system of FIG. 3A according to some implementations. In the illustrated example, the ultrasonic sensing system 300 may implement the ultrasonic sensing system 118 described with reference to FIG. 1 or the ultrasonic sensing system 200 shown and described with reference to FIGS. 2A and 2B. The ultrasonic sensing system 300 may include an ultrasonic transducer 302 that overlies a substrate 304 and that underlies a platen (a "cover plate" or "cover glass") 306. The ultrasonic transducer 302 may include both an ultrasonic transmitter 308 and an ultrasonic receiver 310.

The ultrasonic transmitter 308 may be configured to generate ultrasonic waves towards the platen 306, and a target object 312 positioned on the upper surface of the platen 306. In the illustrated implementation the object 312 is depicted as finger, but any appendage or body part may be contemplated by the present techniques, as well as any other natural or artificial object. In some implementations, the ultrasonic transmitter 308 may more specifically be configured to generate ultrasonic plane waves towards the platen 306. In some implementations, the ultrasonic transmitter 308 includes a layer of piezoelectric material such as, for example, polyvinylidene fluoride (PVDF) or a PVDF copolymer such as poly(vinylidenefluoride-co-trifluoroethylene) (PVDF-TrFE). For example, the piezoelectric material of the ultrasonic transmitter 308 may be configured to convert electrical signals provided by the controller of the ultrasonic sensing system into a continuous or pulsed sequence of ultrasonic plane waves at a scanning frequency. In some implementations, the ultrasonic transmitter 308 may additionally or alternatively include capacitive ultrasonic devices.

The ultrasonic receiver 310 may be configured to detect ultrasonic reflections 314 resulting from interactions of the ultrasonic waves transmitted by the ultrasonic transmitter 308 with ridges 316 and valleys 318 defining surface texture of the target object 312 being scanned. In some implementations, the ultrasonic transmitter 308 overlies the ultrasonic receiver 310 as, for example, illustrated in FIGS. 3A and 3B. In some other implementations, the ultrasonic receiver 310 may overlie the ultrasonic transmitter 308. The ultrasonic receiver 310 may be configured to generate and output electrical output signals corresponding to the detected ultrasonic reflections. In some implementations, the ultrasonic receiver 310 may include a second piezoelectric layer different than the piezoelectric layer of the ultrasonic transmitter 308. For example, the piezoelectric material of the ultrasonic receiver 310 may be any suitable piezoelectric material such as, for example, a layer of PVDF or a PVDF copolymer. The piezoelectric layer of the ultrasonic receiver 310 may convert vibrations caused by the ultrasonic reflections into electrical output signals. In some implementations, the ultrasonic receiver 310 further includes a thin-film transistor (TFT) layer. In some such implementations, the TFT layer may include an array of sensor pixel circuits configured to amplify the electrical output signals generated by the piezoelectric layer of the ultrasonic receiver 310. The amplified electrical signals provided by the array of sensor pixel circuits may then be provided as raw measured image data to the processing unit for use in processing the image data, identifying a fingerprint associated with the image data, and in some applications, authenticating a user associated with the fingerprint. In some implementations, a single piezoelectric layer may serve as the ultrasonic transmitter 308 and the ultrasonic receiver 310. In some implementations, the substrate 304 may be a glass, plastic or silicon substrate upon which electronic circuitry may be fabricated. In some implementations, an array of sensor pixel circuits and associated interface circuitry of the ultrasonic receiver 310 may be configured from CMOS circuitry formed in or on the substrate 304. In some implementations, the substrate 304 may be positioned between the platen 306 and the ultrasonic transmitter 308 and/or the ultrasonic receiver 310. In some implementations, the substrate 304 may serve as the platen 306. One or more protective layers, acoustic matching layers, anti-smudge layers, adhesive layers, decorative layers, conductive layers or other coating layers (not shown) may be included on one or more sides of the substrate 304 and the platen 306.

The platen 306 may be formed of any suitable material that may be acoustically coupled with the ultrasonic transmitter 308. For example, the platen 306 may be formed of one or more of glass, plastic, ceramic, sapphire, metal or metal alloy. In some implementations, the platen 306 may be a cover plate such as, for example, a cover glass or a lens glass of an underlying display. In some implementations, the platen 306 may include one or more polymers, such as one or more types of parylene, and may be substantially thinner. In some implementations, the platen 306 may have a thickness in the range of about 10 microns (μm) to about 1000 μm or more. In some implementations, the platen 306 may be configured as a multilayer stack of multi-layer stacks of glass, plastic and/or adhesive layers.

Figure 3C:
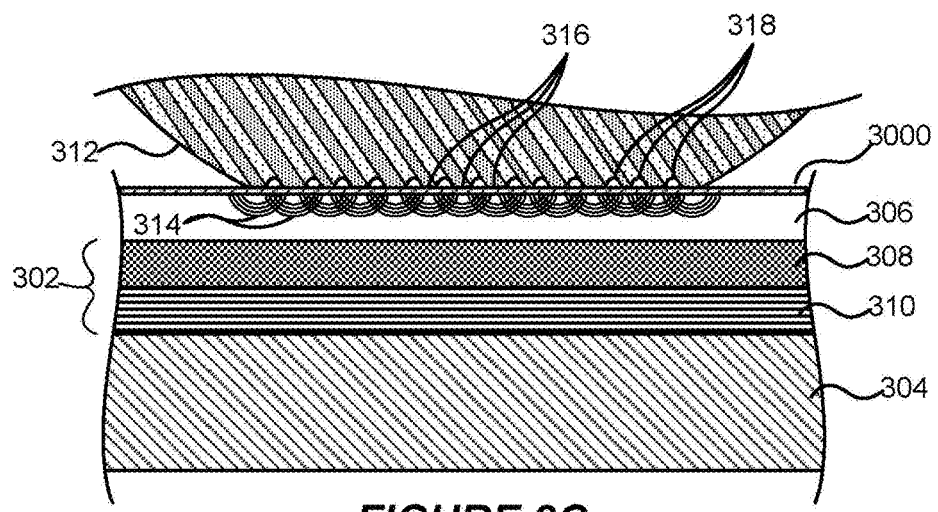

As illustrated in FIGS. 3A and 3B, the target object 312 is in direct contact with the platen 306. However, in some implementations a screen protector may be disposed over the platen 306. FIG. 3C illustrates an implementation in which a screen protector 3000 is disposed above the platen 306. Such a screen protector may be installed (or removed) by a user or third party after factory calibration of the ultrasonic sensing system 300.

In order to accommodate variations in thickness and material properties of the platen (plus, in some instances screen protector), the ultrasonic transducers, advantageously, may be operable at a variety of values of range gate delay.

Figure 4:
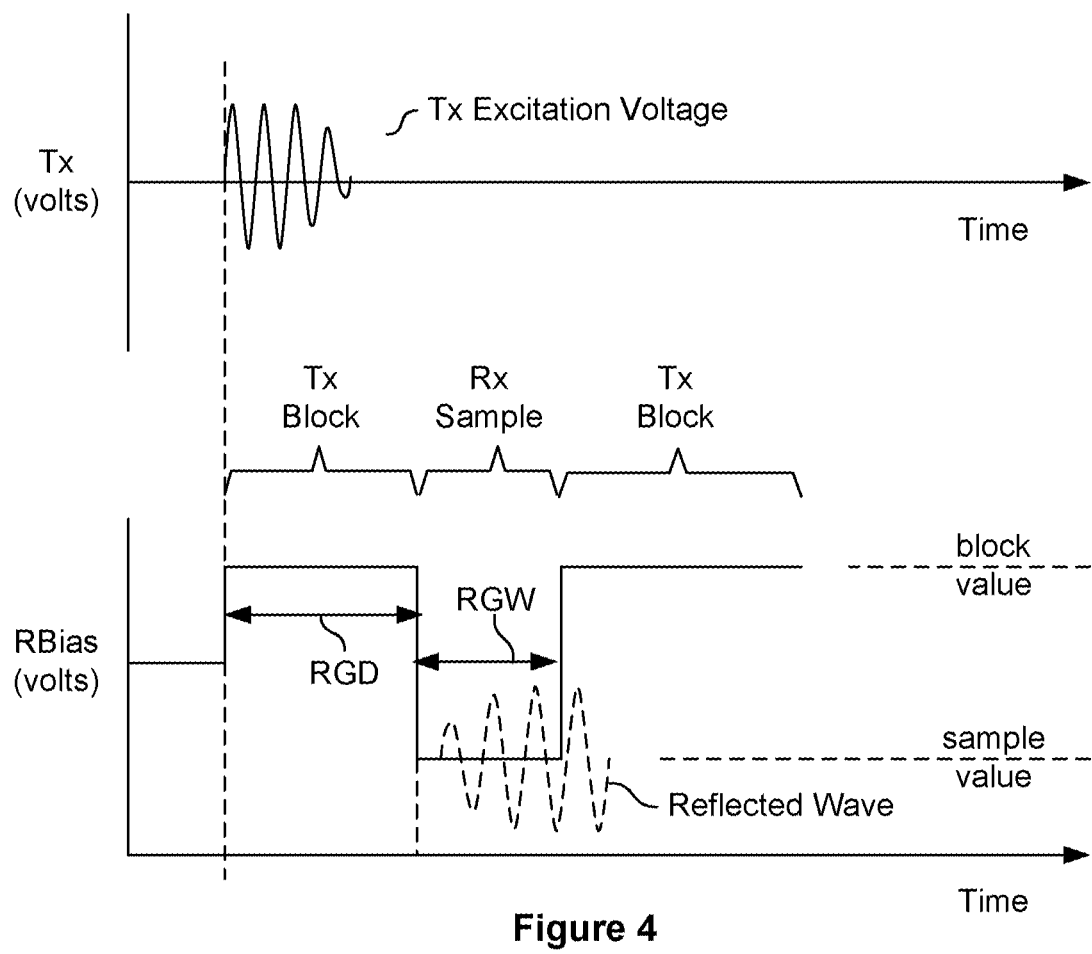
FIG. 4 illustrates an example of range gate delay (RGD) and range gate window (RGW).

FIG. 4 illustrates an example of range gate delay as the term is used herein. More particularly, FIG. 4 graphically illustrates an example of transmitter excitation signals and receiver bias voltage levels as a function of time. The transmitter excitation signals (upper graph) may be provided to an ultrasonic transmitter, whereas the receiver bias voltage (lower graph) may be applied to an RBias electrode of an ultrasonic sensor element. One or more cycles of an ultrasonic transmitter excitation signal may be applied to the ultrasonic transmitter, as shown in the upper graph of FIG. 4. In some implementations, a single transmitter excitation cycle may be used. In some implementations, as illustrated, multiple excitation cycles may be used, such as two cycles, three cycles, four cycles, five cycles or more. The transmitter excitation signals in some implementations may be square waves, rectangular waves, partial waves, pulsed waves, multiple-frequency waves, chirped waves, low or high duty-cycle waves, variable-amplitude waves, variable-frequency waves, or other suitable waveform for driving an ultrasonic transmitter. During a first portion of time ("Tx Block") when transmission of the outgoing ultrasonic wave is occurring, the bias voltage applied to the RBias electrode may correspond to a "block value" such that the receiver bias electrode prevents signals reflected from outgoing transmitted waves from being captured by a sensor pixel circuit.

During a subsequent portion of time ("Rx Sample"), the bias level of the control signal applied to the RBias electrode is set to a "sample value" and the reflected ultrasonic signals may be captured a sensor pixel. The Rx Sample period may start upon completion of the range gate delay ("RGD") period. The RGD period may typically be in a range of 0.5-2 microseconds. The duration of the Rx sample period may be referred to as the range gate window ("RGW") period. The RGW period may typically be less than one microsecond. In some implementations, the RGW period may be in the range of about 50 to 1000 nanoseconds. To prevent detection of unwanted internal reflections, the bias level applied to the receiver bias electrode may be brought back to the block value upon completion of the RGW period. The RGW period, in the illustrated implementation, may correspond to a time interval that is roughly similar to the period of a transmitter excitation cycle ("tone burst"). In other implementations, the RGW period may be shorter or longer than the period of the tone burst. During RGW period, the sensor pixel may be said to be in a "read mode" of operation. During or near the RGW period, the receiver may output signals, resulting from or corresponding to localized electrical charges generated by the piezoelectric receiver layer and collected by the pixel input electrodes.

In the absence of the presently disclosed techniques, an ultrasonic sensor may be operable (i.e., may exhibit a sufficiently high signal-to-noise ratio (SNR)) over a relatively narrow range of frequency versus RGD. FIG. 5A illustrates a contour plot of SNR as a function of frequency and RGD for an ultrasonic sensor configured according to the prior art. It may be observed that SNR is greater than four only in a region 503 that is generally within a frequency range of 10-12.5 MHz and a normalized RGD of 0.95 to 1.15. In a region 502, SNR is in the range of 2-4, whereas, in a region 501, SNR is less than 2.

Figure 5B:
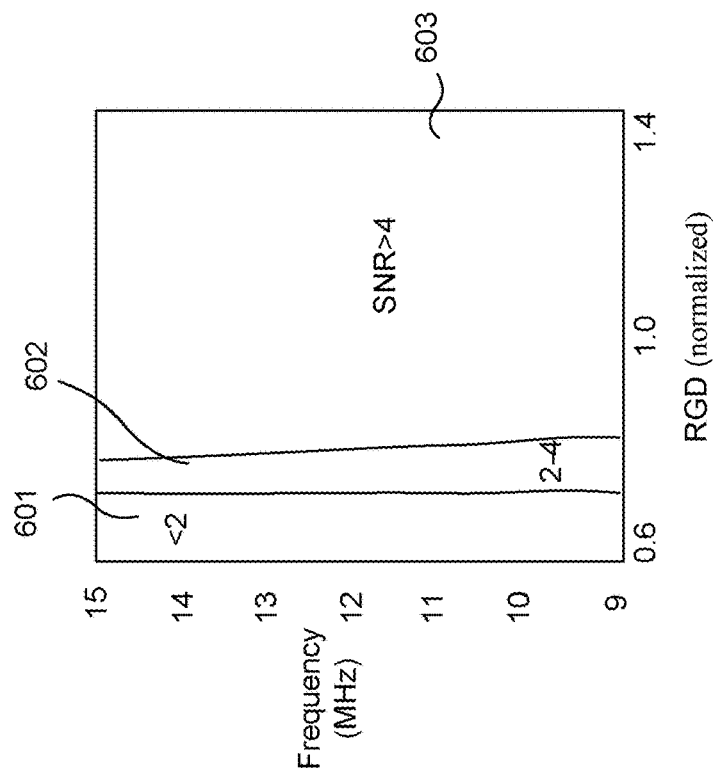
FIG. 5B illustrates plots of signal-to-noise ratio as a function of range gate delay (RGD), according to an implementation.
Figure 5A:
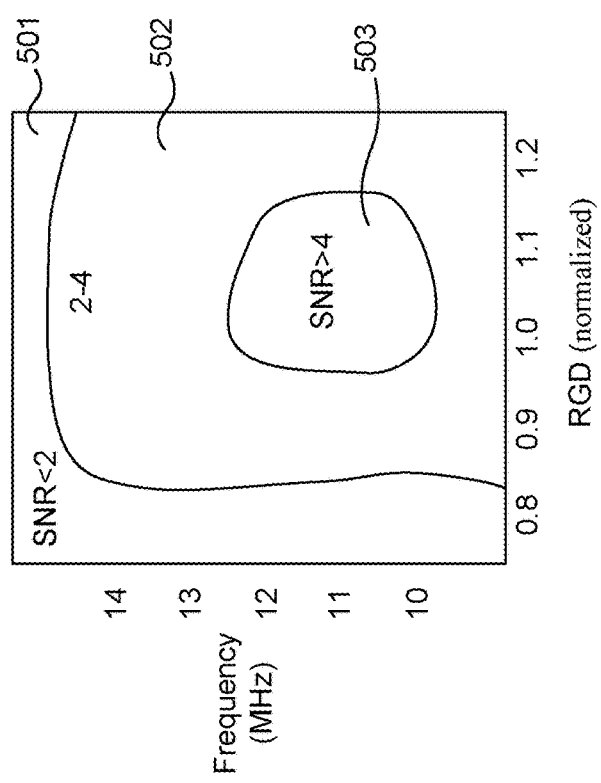
FIG. 5A illustrates plots of signal-to-noise ratio as a function of range gate delay (RGD), according to the prior art.

FIG. 5B illustrates a contour plot of SNR as a function of frequency and RGD, according to an implementation of the presently disclosed techniques. It may be observed that SNR is greater than four over a broad range of frequencies (at least, 9-16 MHz), over a normalized RGD of at least 0.8 to 1.4. In a region 602, SNR is in the range of 2-4, whereas, in a region 601, SNR is less than 2. Because the contour plot of FIG. 6 demonstrates a desirably high value of SNR over a broad range of frequencies (at least 9-16 MHz), ultrasonic sensors exhibiting such performance are referred to herein as "broadband" sensors. Advantageously, such broadband sensors may substantially reduce a need for tuning of the sensor operating parameters such as frequency and RGD. In some implementations, the broadband sensor may operate satisfactorily without adjusting such parameters, whether or not a screen protector is installed removed or replaced. Advantageously the broadband sensor may be operable at a low frequency at which sub-dermis imaging may be performed. In some implementations, the broadband sensor may exhibit SNR>4 over a range of frequencies of at least 5-20 MHz.

Figure 6:
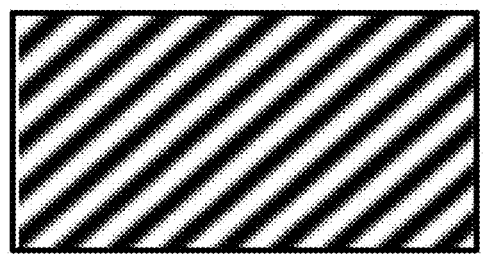
FIG. 6 illustrates an example of adjusting the RGD and performing a background calibration, according to some implementations.
Figure 6:
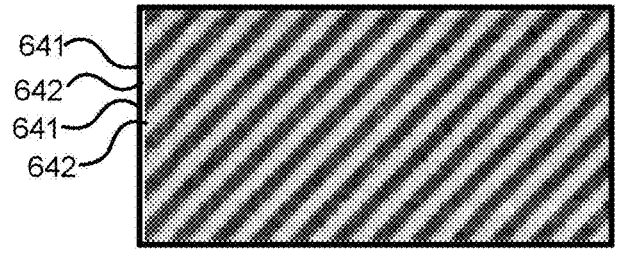

For the plots illustrated in FIGS. 5A and 5B, and in the drawings, specification and claims, generally, SNR may be determined by using a test target template with light and dark regions similar to a pattern exhibited by a fingerprint and obtaining a measured test target image. FIG. 6 illustrates an example of a test target template (Detail A) and an acquired test target image (Detail B). The template may be applied as a mask to the acquired image to extract pixel values within respective dark regions 641 and light regions 642. SNR, as used herein, and in the claims, is the ratio of "signal" (defined as the difference in median pixel values of the light and dark regions) and "noise" (defined as the root-mean-square of the standard deviation, σ, of the light and dark regions); thus:

$$SNR = \frac{(\text{Median dark}) - (\text{Median light})}{\sqrt{\sigma_{Dark}^2 + \sigma_{Light}^2}/2}.$$

Figure 7:
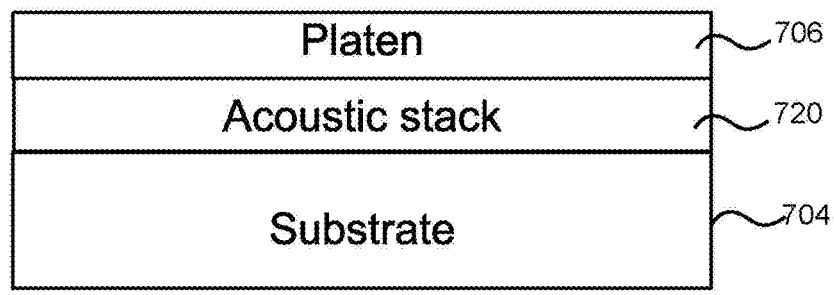
FIG. 7 illustrates a test target template and corresponding received image associated with determination of sensor performance.

FIG. 7 illustrates a broadband ultrasonic sensor, according to some implementations. In the illustrated example, an ultrasonic sensor 700 includes a substrate 704, a platen 706, and an acoustic stack 720 disposed between the substrate 704 and the platen 706. The acoustic stack 720 may include a piezoelectric layer and a thin film transistor (TFT) layer. The platen 706 may include one or more layers of plastic and/or glass and may, in some configurations, include a plastic organic light-emitting diode (OLED) layer. Optionally, a spacer (not illustrated) may be disposed between the platen 706 and the acoustic stack 720. By appropriate selection of design guidelines and drive schemes, the ultrasonic sensor 700 may be configured to exhibit a signal-to-noise ratio of at least 4 over a frequency range of at least 9 to 16 MHz. For example, as described in more detail below, dimensions and/or material properties of components of the acoustic stack 720, of the platen 706 and/or of the optional spacer disposed therebetween may be selected so as to obtain the desired broadband operating characteristics.

Figure 8:
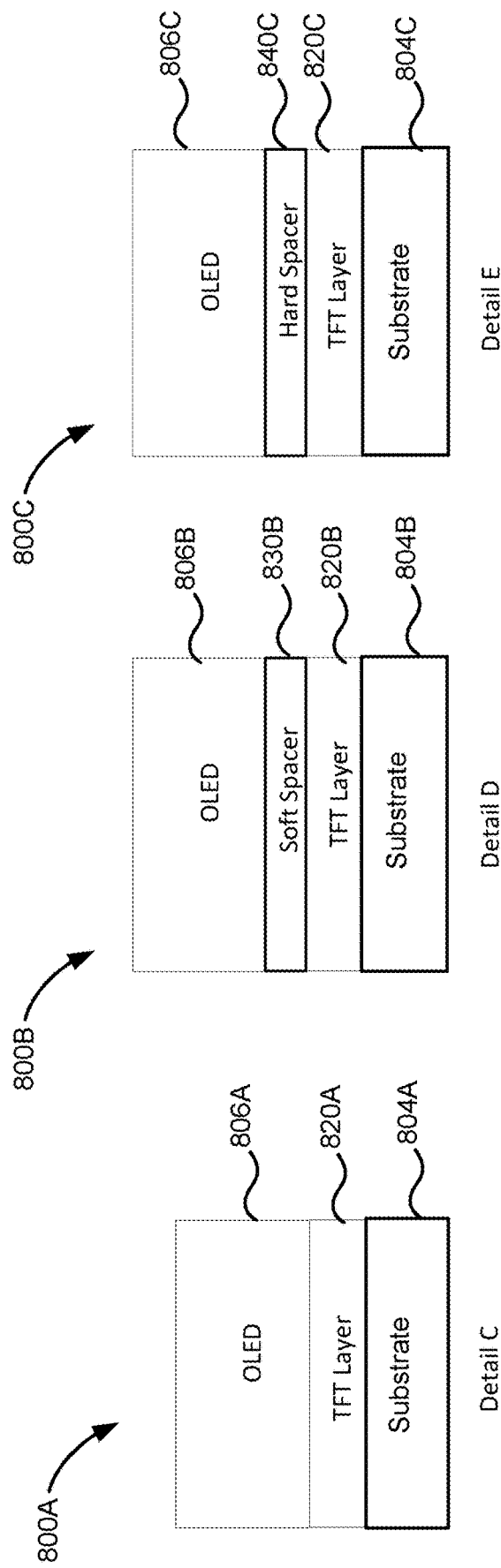
FIG. 8 illustrates examples of broadband ultrasonic sensors, according to some implementations.

FIG. 8 illustrates examples of broadband ultrasonic sensors, according to some implementations. Referring first to Detail C, an ultrasonic sensor 800A includes a substrate 804A, a platen 806A that includes an organic light emitting diode (OLED) layer. The OLED layer may be flexibly disposed within two or more layers of plastic, and be referred to, collectively, as a plastic OLED stack. The ultrasonic sensor 800A includes an acoustic stack 820A that includes a TFT layer disposed between the substrate 804A and the platen 806A. The TFT layer of acoustic stack 820A may or may not be configured as a resonator (i.e., may be configured to resonate at one or more frequencies within the operating frequency band of interest, which may be in the range of 5-20 MHz, for example). Advantageously, the acoustic stack 820A has a total thickness less than λ/2 where λ is a characteristic wavelength of ultrasonic waves passing through the TFT layer. For example, for a 12 MHz signal, λ may be approximately 500 In some implementations the thickness of the TFT layer may be in the range of 90-200 μm.

Referring next to Detail D, an ultrasonic sensor 800B includes a substrate 804B, a platen 806B that includes a plastic OLED stack, an acoustic stack 820B that is or includes a TFT layer disposed between the substrate 804B and a spacer 830B, and the spacer 830B disposed between the acoustic stack 820B and the platen 806B. The TFT layer of acoustic stack 820A may or may not be configured as a resonator. The spacer 830B may be characterized as being "soft", meaning it has no resonant frequency near an operating frequency of the ultrasonic sensor. In some implementations, the OLED stack may include a multilayer structure including at least two of a polarizer, an OLED layer, a touchscreen layer. Advantageously, the OLED stack and the platen exhibit little or no acoustic mismatch. More particularly, an acoustic impedance of the platen and the OLED stack may be approximately similar (i.e., identical within approximately 10%). Alternatively or in addition, in some implementations, a thickness of the platen 806B is small relative to a characteristic wavelength of ultrasonic waves passing through the platen. For example the thickness may be less than ¼ of the characteristic wavelength. Advantageously, in some implementations, the thickness may be less than 1/10 of the characteristic wavelength.

Advantageously, the combined thickness of the acoustic stack 820B and the spacer 830B has a total thickness less than λ/2 where λ is a characteristic wavelength of ultrasonic waves passing through the TFT layer. For example, for a 12 MHz signal, λ, may be approximately 500 μm. In some implementations, the combined thickness may be in the range of 90-200 μm.

Referring next to Detail E, an ultrasonic sensor 800C includes a substrate 804C, a platen 806C that includes a plastic OLED stack, an acoustic stack 820C that includes a TFT layer disposed between the substrate 804C and a spacer 840C. The spacer 840C is disposed between the acoustic stack 820C and the platen 806C. The spacer 830B may be characterized as being "hard", meaning it is configured as a resonator. In such a configuration, advantageously, the TFT layer of acoustic stack 820C is not configured as a resonator. Advantageously, the combined thickness of the acoustic stack 820C and the spacer 840C has a total thickness less than λ/2 where λ is a characteristic wavelength of ultrasonic waves passing through the TFT layer. For example, for a 12 MHz signal, λ, may be approximately 500 μm. In some implementations, the combined thickness may be in the range of 90-200 μm.

Advantageously, any of the ultrasonic sensors 800A, 800B and 800C may be driven by a broadband input, (i.e., over a frequency range of about 5-20 MHz). An appropriate drive schemes may include a signal pulse half pulse the tap a 30 V direct drive square signal, or a chirp signal.

Figure 9:
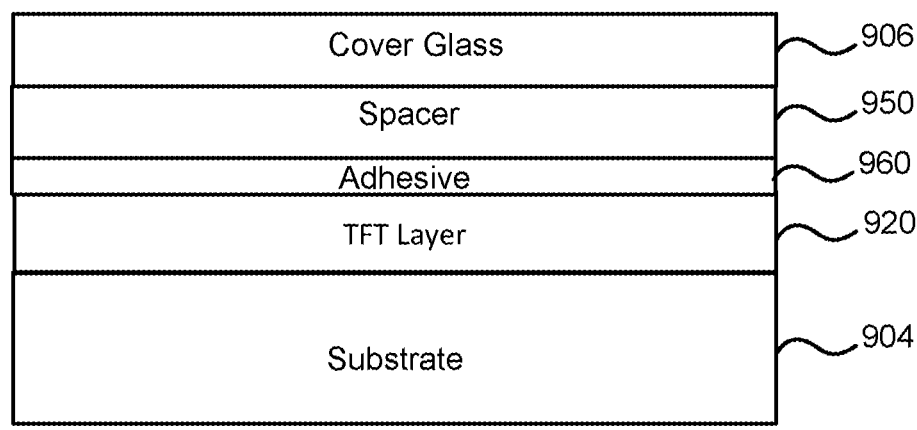
FIG. 9 illustrates an example of a broadband ultrasonic sensor, according to some implementations.

FIG. 9 illustrates an example of a broadband ultrasonic sensor, according to some implementations. In the illustrated example, an ultrasonic sensor 900 includes a substrate 904, a platen 906 that includes a cover glass layer, and an acoustic stack 920 that includes a TFT layer disposed between the substrate 904 and an adhesive layer 960. The adhesive layer 960 is disposed between the TFT layer of acoustic stack 920 and a spacer 950. The spacer 950 is disposed between the adhesive layer 960 and the cover glass 906. The TFT layer of acoustic stack 820A may or may not be configured as a resonator. The cover glass of platen 906 may be a multilayer structure including any number of transparent layers. For example, the cover glass may include a polarizer, an OLED layer, a touchscreen layer and/or a screen protector. The adhesive layer 960 may be or include a pressure sensitive adhesive (PSA).

Figure 10:
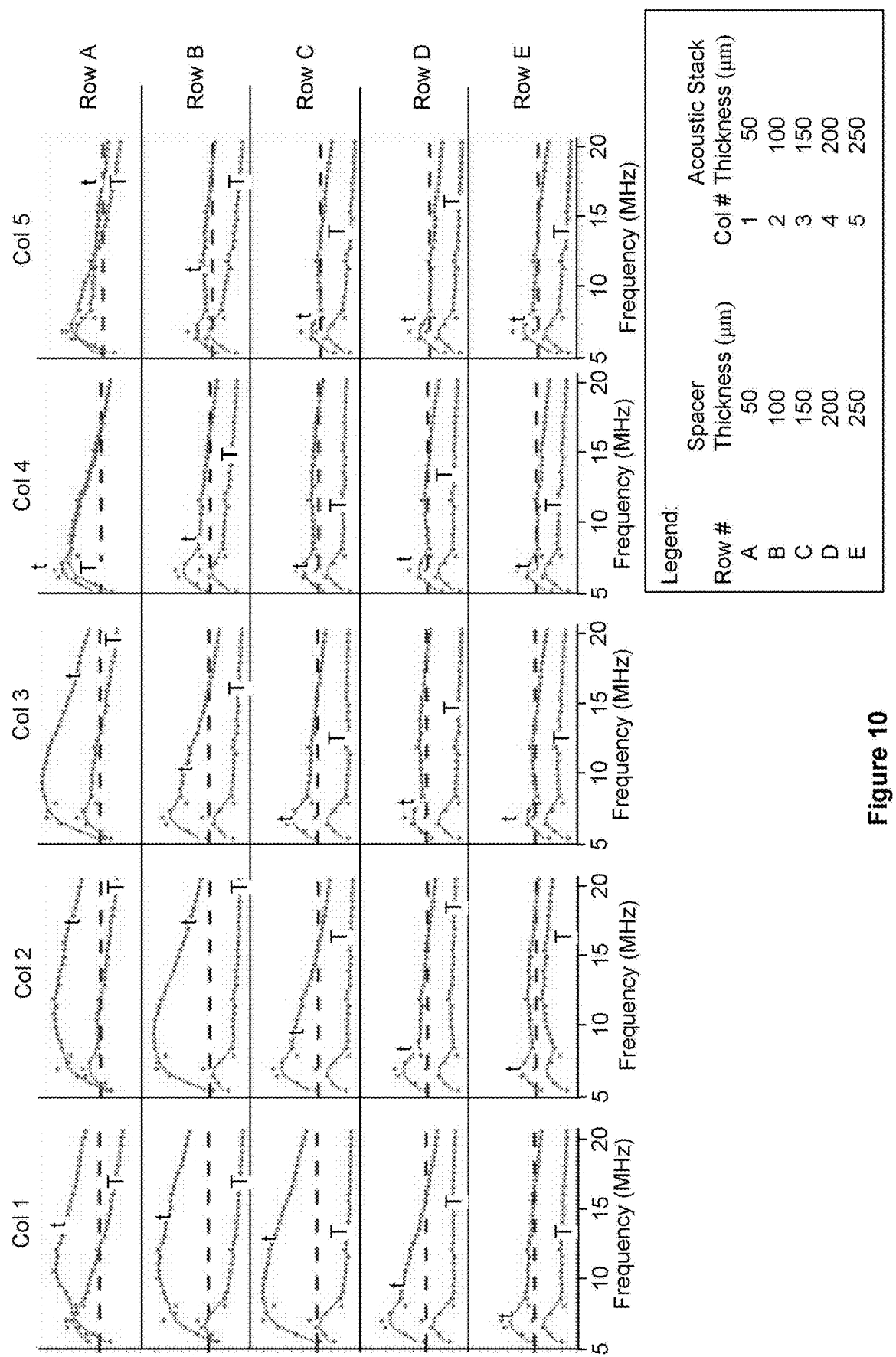
FIG. 10 presents example performance results for a number of candidate implementations.

The present inventors have simulated performance of the ultrasonic sensor 900, using various assumed dimensional and material properties. For example, parametric studies of performance as a function of thickness of the thickness of the spacer 950, thickness of the adhesive layer 960, and thickness of the acoustic stack layer 920 were performed. FIG. 10 presents example performance results for a number of candidate implementations. The results plot SNR as a function of frequency for 50 different combinations of spacer thickness, adhesive layer thickness and acoustic stack thickness. As indicated in the legend of FIG. 10, spacer thickness and acoustic stack thickness were each modeled as having a thickness of 50, 100, 150, 200 and 250 For each of the resulting 25 combinations of spacer thickness and acoustic stack thickness, a cell includes two plots: a first plot labeled 't' represents modeled results for an adhesive layer thickness of 0.1 µm and a second plot labeled 'T' represents modeled results for an adhesive layer thickness of 10 µm. A dashed horizontal line in each of the 25 cells represents a desired SNR of about 4.

The results demonstrate that, for instances where the adhesive layer is "thin" (0.1 µm) a combined thickness of the acoustic stack 920 and the spacer 950 may be as large as 250 µm while still maintaining SNR>4 through at least most of the frequency range of 5 to 20 MHz. For instances where the adhesive layer is "thick" (10 µm), the spacer 950 is advantageously avoided or made very thin, and a thickness of the acoustic stack 920 may, advantageously, be less than 250 µm.

Figure 11C:
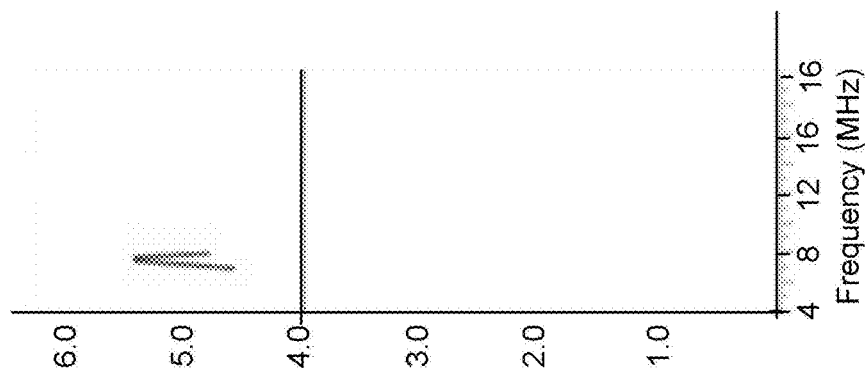
FIGS. 11A-11C present example performance results for three additional candidate implementations.
Figure 11B:
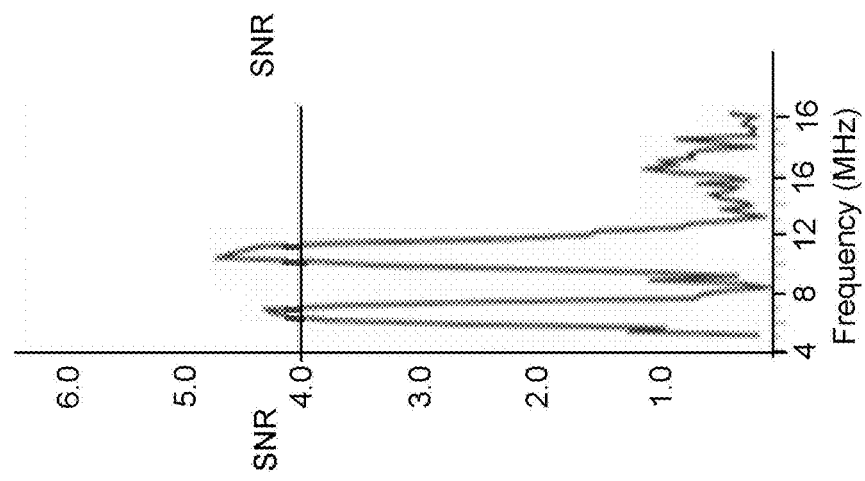
Figure 11A:
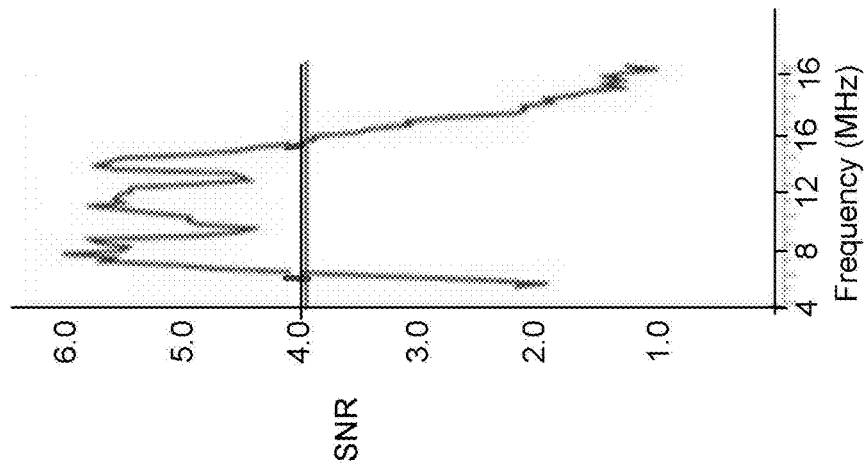

As a further example, parametric studies of performance as a function of range gate window (RGW, as described hereinabove) and for variously composed acoustic stacks were performed. FIGS. 11A-11C present example performance results for three additional candidate implementations. SNR as a function of frequency is depicted for each of the example implementations. The plot illustrated in FIG. 11A, of an implementation including an acoustic stack including a zirconate titanate (PZT) piezoelectric and using a relatively narrow RGW value of 50 ns compares favorably to two alternative implementations illustrated in FIGS. 11B and 11C. FIG. 11B models performance of an implementation using the same acoustic stack as FIG. 11A, but operated with a relatively wide RGW value of 800 ns. FIG. 11C depicts performance of an implementation including an acoustic stack including polyvinylidene fluoride, instead of PZT, with an RGW value of 50 ns.

Thus, an improved ultrasonic sensor has been disclosed. It will be appreciated that a number of alternative configurations and operating techniques may be contemplated.

As used herein, a phrase referring to "at least one of" a list of items refers to any combination of those items, including single members. As an example, "at least one of: a, b, or c" is intended to cover: a, b, c, a-b, a-c, b-c, and a-b-c.

The various illustrative logics, logical blocks, modules, circuits and algorithm processes described in connection with the implementations disclosed herein may be implemented as electronic hardware, computer software, or combinations of both. The interchangeability of hardware and software has been described generally, in terms of functionality, and illustrated in the various illustrative components, blocks, modules, circuits and processes described above. Whether such functionality is implemented in hardware or software depends upon the particular application and design constraints imposed on the overall system.

The hardware and data processing apparatus used to implement the various illustrative logics, logical blocks, modules and circuits described in connection with the aspects disclosed herein may be implemented or performed with a general purpose single- or multi-chip processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor may be a microprocessor or any conventional processor, controller, microcontroller, or state machine. A processor also may be implemented as a combination of computing devices, e.g., a combination of a DSP and a microprocessor, a plurality of microprocessors, one or more microprocessors in conjunction with a DSP core, or any other such configuration. In some implementations, particular processes and methods may be performed by circuitry that is specific to a given function.

In one or more aspects, the functions described may be implemented in hardware, digital electronic circuitry, computer software, firmware, including the structures disclosed in this specification and their structural equivalents thereof, or in any combination thereof. Implementations of the subject matter described in this specification also may be implemented as one or more computer programs, i.e., one or more modules of computer program instructions, encoded on a computer storage media for execution by or to control the operation of data processing apparatus.

If implemented in software, the functions may be stored on or transmitted over as one or more instructions or code on a computer-readable medium, such as a non-transitory medium. The processes of a method or algorithm disclosed herein may be implemented in a processor-executable software module which may reside on a computer-readable medium. Computer-readable media include both computer storage media and communication media including any medium that may be enabled to transfer a computer program from one place to another. Storage media may be any available media that may be accessed by a computer. By way of example, and not limitation, non-transitory media may include RAM, ROM, EEPROM, CD-ROM or other optical disk storage, magnetic disk storage or other magnetic storage devices, or any other medium that may be used to store desired program code in the form of instructions or data structures and that may be accessed by a computer. Also, any connection may be properly termed a computer-readable medium. Disk and disc, as used herein, includes compact disc (CD), laser disc, optical disc, digital versatile disc (DVD), floppy disk, and blu-ray disc where disks usually reproduce data magnetically, while discs reproduce data optically with lasers. Combinations of the above should also be included within the scope of computer-readable media. Additionally, the operations of a method or algorithm may reside as one or any combination or set of codes and instructions on a machine readable medium and computer-readable medium, which may be incorporated into a computer program product.

Various modifications to the implementations described in this disclosure may be readily apparent to those skilled in the art, and the generic principles defined herein may be applied to other implementations without departing from the spirit or scope of this disclosure. Thus, the disclosure is not intended to be limited to the implementations shown herein, but is to be accorded the widest scope consistent with the claims, the principles and the novel features disclosed herein. The word "exemplary" is used exclusively herein, if at all, to mean "serving as an example, instance, or illustration." Any implementation described herein as "exemplary" is not necessarily to be construed as preferred or advantageous over other implementations.

Certain features that are described in this specification in the context of separate implementations also may be implemented in combination in a single implementation. Conversely, various features that are described in the context of a single implementation also may be implemented in multiple implementations separately or in any suitable subcombination. Moreover, although features may be described above as acting in certain combinations and even initially claimed as such, one or more features from a claimed combination may in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed to achieve desirable results. Further, the drawings may schematically depict one more example processes in the form of a flow diagram. However, other operations that are not depicted may be incorporated in the example processes that are schematically illustrated. For example, one or more additional operations may be performed before, after, simultaneously, or between any of the illustrated operations. In certain circumstances, multitasking and parallel processing may be advantageous. Moreover, the separation of various system components in the implementations described above should not be understood as requiring such separation in all implementations, and it should be understood that the described program components and systems may generally be integrated together in a single software product or packaged into multiple software products. Additionally, other implementations are within the scope of the following claims. In some cases, the actions recited in the claims may be performed in a different order and still achieve desirable results. It will be understood that unless features in any of the particular described implementations are expressly identified as incompatible with one another or the surrounding context implies that they are mutually exclusive and not readily combinable in a complementary and/or supportive sense, the totality of this disclosure contemplates and envisions that specific features of those complementary implementations may be selectively combined to provide one or more comprehensive, but slightly different, technical solutions. It will therefore be further appreciated that the above description has been given by way of example only and that modifications in detail may be made within the scope of this disclosure.

What is claimed is:

1. An ultrasonic sensor comprising:
a substrate;
a platen;
an acoustic stack residing between the substrate and the platen, including at least one piezoelectric layer and a thin-film transistor (TFT) layer; and
a spacer residing between the acoustic stack and the platen, wherein
the ultrasonic sensor is configured to exhibit a signal-to-noise ratio (SNR) of at least 4 over a frequency range of at least 9 to 16 MHz.

2. The ultrasonic sensor of claim 1, further comprising an OLED stack, the OLED stack and the platen each exhibiting an approximately similar acoustic impedance.

3. The ultrasonic sensor of claim 2, wherein the OLED stack comprises a multilayer structure including at least two of a polarizer, an OLED layer, and a touchscreen layer.

4. The ultrasonic sensor of claim 1, wherein the platen comprises a polycarbonate (PC) layer.

5. The ultrasonic sensor of claim 4, wherein the platen comprises a multilayer structure including the PC layer and a poly methacrylate layer.

6. The ultrasonic sensor of claim 1, wherein:
the sensor is configured to operate with ultrasonic waves having a characteristic wavelength; and
the platen has a thickness less than ¼ of the characteristic wavelength.

7. The ultrasonic sensor of claim 6, wherein the thickness is less than 1/10 of the characteristic wavelength.

8. The ultrasonic sensor of claim 1, wherein the piezoelectric layer includes one or more of lead zirconate titanate (PZT), single crystal lead magnesium niobate-lead titanate (PMN-PT), a PZT ceramic, polyvinylidene fluoride (PVDF), poly(vinylidenefluoride-co-trifluoroethylene) (PVDF-TrFE) and/or another PVDF copolymer.

9. The ultrasonic sensor of claim 1, wherein the TFT layer has a thickness less than 300 μm.

10. The ultrasonic sensor of claim 1, wherein the TFT layer is configured to resonate at one or more frequencies in the range of 5-20 MHz.

11. The ultrasonic sensor of claim 1, wherein:
the sensor is configured to operate with ultrasonic waves having a characteristic wavelength; and
the acoustic stack has a total thickness less than ½ the characteristic wavelength.

12. The ultrasonic sensor of claim 11, wherein the acoustic stack has a total thickness in a range of 90-200 μm.

13. The ultrasonic sensor of claim 1, wherein:
the sensor is configured to operate with ultrasonic waves having a characteristic wavelength; and
a combined thickness of the acoustic stack and the spacer is less than ½ the characteristic wavelength.

14. The ultrasonic sensor of claim 13, where the combined thickness is in a range of 90-200 μm.

15. The ultrasonic sensor of claim 1, wherein the platen comprises a cover glass layer.

16. The ultrasonic sensor of claim 1, further comprising an adhesive layer residing between the TFT layer and the spacer.

17. The ultrasonic sensor of claim 16, wherein the adhesive layer is a pressure sensitive adhesive (PSA) or optical clear adhesive (OCA).

18. The ultrasonic sensor of claim 1, wherein the sensor is configured to exhibit SNR of at least 4 over a frequency range of at least 5-20 MHz.

19. An ultrasonic sensor comprising:
a substrate;
a platen;
an acoustic stack residing between the substrate and the platen, including at least one piezoelectric layer and a thin-film transistor (TFT) layer;
a spacer residing between the acoustic stack and the platen; and
a display stack, the display stack and the platen each exhibiting an approximately similar acoustic impedance, wherein
the ultrasonic sensor is configured to exhibit a signal-to-noise ratio (SNR) of at least 4 over a frequency range of at least 9 to 16 MHz.

* * * * *